(12) United States Patent
Ostby

(10) Patent No.: US 6,687,124 B2
(45) Date of Patent: Feb. 3, 2004

(54) APPARATUS FOR COOLING ELECTRONIC COMPONENTS IN A PHASE CHANGE ELECTRONIC COOLING SYSTEM

(75) Inventor: Gary B Ostby, Sterling Hts., MI (US)

(73) Assignee: General Motors Corporation, Detroit, MI (US)

( * ) Notice: Subject to any disclaimer, the term of this patent is extended or adjusted under 35 U.S.C. 154(b) by 30 days.

(21) Appl. No.: 10/178,285

(22) Filed: Jun. 24, 2002

(65) Prior Publication Data

US 2003/0235036 A1 Dec. 25, 2003

(51) Int. Cl.[7] ................................................. H05K 7/20
(52) U.S. Cl. .................... 361/700; 165/104.33; 257/715
(58) Field of Search ................................ 165/80.3, 80.4, 165/104.21, 104.33; 257/714, 715; 62/259.2; 174/15.1; 361/689, 690, 699, 700, 701, 717–719

(56) References Cited

U.S. PATENT DOCUMENTS

| | | | | |
|---|---|---|---|---|
| 3,986,550 A | * | 10/1976 | Mitsuoka | ................ 165/104.21 |
| 4,330,033 A | * | 5/1982 | Okada et al. | ........... 165/104.27 |
| 4,790,370 A | * | 12/1988 | Niggemann | ............ 165/104.33 |
| 5,349,831 A | * | 9/1994 | Daikoku et al. | ............... 62/376 |
| 5,390,077 A | * | 2/1995 | Paterson | ...................... 361/700 |

* cited by examiner

Primary Examiner—Gerald Tolin
(74) Attorney, Agent, or Firm—Laura C. Hargitt

(57) ABSTRACT

An apparatus for cooling electronic components disposed in a sealed container in a phase change electronic cooling system includes a hood disposed in the container adjacent the electronic components. The electronic components and the hood are immersed in a nonconductive liquid that partially fills the container when the container is in a predetermined location relative to the ground. The apparatus also includes at least one cooling tube having one end connected to the hood and an opposite end disposed adjacent a portion of the electronic components whereby during operation the electronic components transfer heat to the liquid, causing the liquid below the hood to vaporize forming bubbles, the bubbles traveling through the at least one tube and carrying an entrained portion of the liquid to said opposite end. When the container is oriented to expose the portion of the electronic components above the liquid level, the bubbles and the entrained liquid exit the opposite end of the at least one tube onto the exposed portion of the electronic components to cool the exposed portion of the electronic components.

9 Claims, 1 Drawing Sheet

APPARATUS FOR COOLING ELECTRONIC COMPONENTS IN A PHASE CHANGE ELECTRONIC COOLING SYSTEM

BACKGROUND OF THE INVENTION

The present invention relates generally to cooling systems for electronics packages and, in particular, to an apparatus for cooling electronic components in a phase change electronic cooling system.

Electronic components, such as field effect transistors (FETs) and other types of transistors, generate large amounts of heat in operation and need to be cooled in order to operate at peak efficiency. Numerous types of cooling systems are utilized to cool electronics, including electric fans for ventilating electronic device housings and air conditioning units for those electronic components located in enclosed rooms. Phase change electronic cooling systems, so named because they utilize the heat generated from electronic components to change a liquid coolant to a vapor state to cool the electronic equipment, are also well known. The latent heat of vaporization, for most liquids, is quite substantial, and thus provides an ideal means for absorbing heat from a heat source. In addition, phase change cooling systems offer the ability to reduce packaging space and provide the most efficient electronic component cooling. A typical phase change electronic cooling system is a closed cycle system where the electronic components are placed in a sealed container and immersed in a nonconductive liquid including, but not limited to, Fluorinert® liquid, manufactured by the 3M Corporation. As the liquid absorbs heat from the electronic components, the liquid boils, turning into a vapor state in a space above the surface of the liquid. The vapor then transfers its heat to a heat exchanger, typically located at the top of the sealed container, and in the process is converted back to a liquid, returning to the liquid in the bottom of the container, where the closed cycle begins again. This type of cooling system is very efficient when the electronics remain immersed in the liquid but the system is dependent on the electronics to be immersed in the liquid for cooling, because the vapor cannot readily absorb any more heat in that state.

When an electronics package with a phase change cooling system is mounted in an automotive vehicle, however, there is a tendency for the electronic components to be exposed to the vapor as the vehicle encounters hills or performs dynamic maneuvers because as the vehicle moves away from the normal horizontal orientation, the liquid tends not to stay level or splashes about. This is disadvantageous because when the electronic components are surrounded only by vapor, and not coolant. The prior art has recognized this problem and has attempted to rectify the problem by providing phase change cooling systems that include a pump that provides pressurized nonconductive liquid to conduits adjacent to the electronic components surrounded by vapor. This type of cooling system, however, is disadvantageous because of the high cost of the pumps, the prime mover, and the piping, relative to the cost of the electronics and the sealed container. In addition, the cooling system operation is dependent on the operation of the pump.

It is desirable, therefore, to provide a cost-effective and efficient means for cooling electronic components in a phase change electronic cooling system regardless of the orientation of the electronic components or the vehicle operating mode.

SUMMARY OF THE INVENTION

The present invention concerns a passive cooling system for electronic components in a phase change cooling system. The cooling system includes electronic components located in a sealed container partially filled with a nonconductive liquid. The liquid is preferably Fluorinert® liquid, manufactured by the 3M Corporation, or another similar nonconductive liquid. The electronic components are immersed in the liquid when the container is in a predetermined orientation relative to the ground. The present invention also includes a hood, located above the high heat generating electronic components near the bottom of the sealed container. Attached to the hood is one end of at least one tube that will allow the vaporized coolant generated from cooling the components to be directed into the tube. The upward motion of the vapor forms bubbles and carries the bubbles and entrained nonconductive liquid into the one end and up the tube. An opposite end of the at least one tube is located adjacent to a portion of the electronics. A heat exchanger, in fluid communication with a fluid transfer system, is located at an upper portion of the sealed container. In operation, the electronics transfer heat to the nonconductive liquid, which vaporizes and forms vapor bubbles. The vapor bubbles rise to the upper portion of the sealed container, are condensed by the heat exchanger, return to the liquid level, and the cycle repeats.

The opposite end of the at least one tube is also located in a manner that directs the coolant and vapor flow to the electronic components that are exposed only to coolant vapors when climbing hills or during dynamic vehicle maneuvers. When the container is oriented to expose a portion of the electronic components above the liquid level, the bubbles and the entrained liquid exit the opposite end of the at least one tube onto the exposed portion of the electronic components to cool the exposed portion of the electronic components.

The present invention advantageously allows for continuous contact of the liquid form of the phase change coolant with the electronic components regardless of the orientation or dynamic inputs to the electronics. The tubes are used like a hose or fountain to assure adequate cooling of all the electronic components in the container in all vehicle operating modes.

DESCRIPTION OF THE DRAWINGS

The above, as well as other advantages of the present invention, will become readily apparent to those skilled in the art from the following detailed description of preferred embodiment when considered in the light of the accompanying drawings in which.

DESCRIPTION OF THE PREFERRED EMBODIMENT

Figure 1:
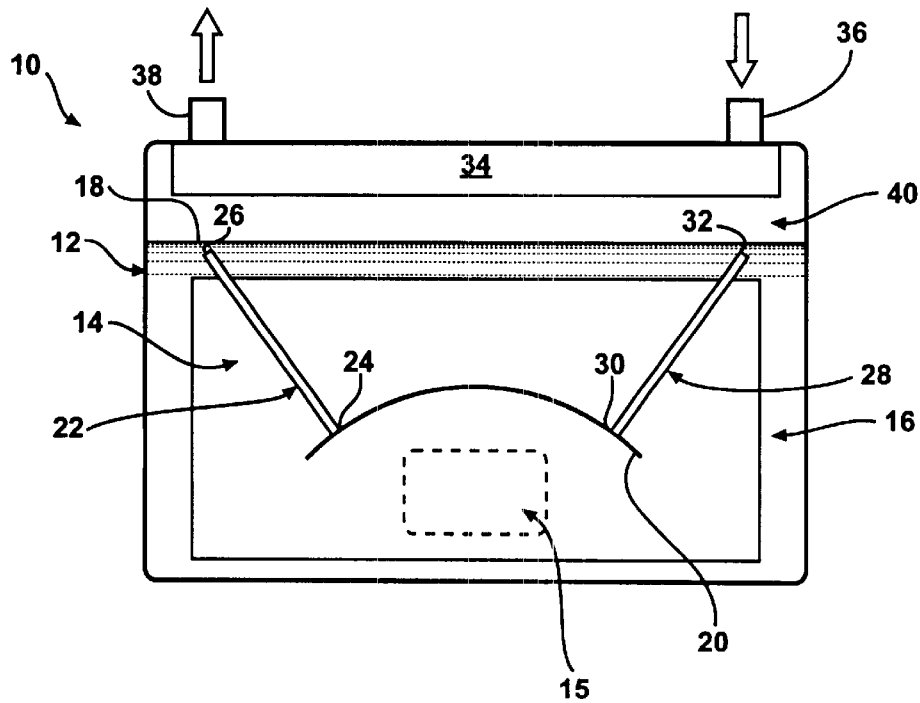
FIG. 1 is a general schematic view of a phase change cooling system in accordance with the present invention in a horizontal orientation.

Referring now to FIG. 1, a phase change cooling system for is indicated generally at 10. The cooling system 10 includes a sealed container 12 having a plurality of electronic components 14, including at least one electronic component 15 such as such as a field effect transistor (FET), disposed therein. The container 12 is shown in a normal position installed in a vehicle. Typically, the electronic components 14 are mounted on a printed circuit board and the electronics 15 are positioned near the bottom of the container 12. The electronic components 14 and the electronics 15 are connected to an electrical power source (not shown) and generate significant heat when operating. A nonconductive liquid 16 partially fills the container 12 up to a normal liquid level 18. The liquid 16 is preferably Fluorinert® liquid, manufactured by the 3M Corporation, or another similar nonconductive liquid. The liquid level 18 corresponds to the liquid/vapor interface of the liquid 16 when the bottom portion of the container 12 is oriented generally horizontal with respect to the ground (not shown). The liquid 16 completely immerses the electronic components 14 including the high heat generating electronics 15. A hood 20 is disposed in the liquid 16 between the high heat generating electronics 15 and the liquid level 18. The hood 20 is downwardly curved or bowed. A first tube 22 having a first end 24 and a second end 26 and a second tube 28 having a first end 30 and a second end 32 are attached at their respective first ends 24 and 30 to the hood 20. The second end 26 of the first tube 22 and the second end 32 of the second tube 28 extend above the hood 20 and are located adjacent a portion of the electronic components 14, outlined in more detail below. A heat exchanger 34 is located at a top portion of the container 12 surrounded by the vapor. The heat exchanger 34 includes an inlet 36 and an outlet 38 that are in fluid communication with another fluid system (not shown), such as an engine cooling system or a totally separate system.

In operation, the electronic components 14 generate heat through normal operation. The heat from the electronic components 14 transfer heat to the nonconductive liquid 16. The liquid 16 absorbs the heat and eventually a portion of the liquid 16 vaporizes and forms bubbles (not shown). The vaporized liquid rises to an upper portion 40 of the container 12 and makes contact with the heat exchanger 34. The fluid (not shown) from the fluid system in the heat exchanger 34 absorbs the heat from the vaporized liquid, condensing the vapor back into the liquid form, which returns to the remainder of the liquid 16 below the liquid level 18 in the container 12, where the cycle begins again. The vapor that forms beneath the hood 20 forms bubbles (not shown). The bubbles carry a portion of entrained liquid (not shown) with them into the respective first ends 24 and 30 of the tubes 22 and 28. The bubbles and the entrained liquid exit the tubes 22 and 28 at their respective second ends 26 and 32 below the liquid level 18, where the vapor bubbles rise towards the heat exchanger 34 and the entrained liquid remains with the remainder of the nonconductive liquid 16 below the liquid level 18.

Figure 2:
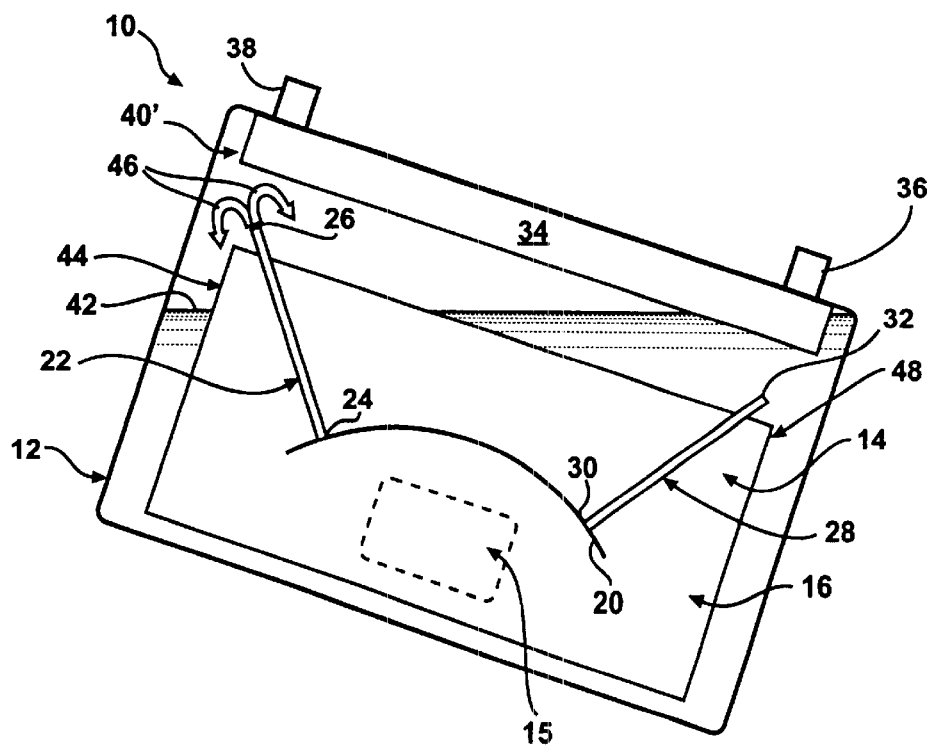
FIG. 2 is general schematic view of the phase change cooling system shown in FIG. 1 in a non-horizontal orientation.

Referring now to FIG. 2, the cooling system 10 is shown with the container 12 in a non-horizontal position, such as when the vehicle is on an incline. The nonconductive liquid 16 partially fills the container 12, as in FIG. 1, but in this orientation, the electronics 14 are not completely immersed in the nonconductive liquid 16, and a portion 44 of the electronics 14 is exposed above the liquid level 42, disadvantageously exposing it to vapor only, where the likelihood that the portion 44 of the electronics 14 will overheat and fail. The liquid level 42 also touches a portion of the heat exchanger 34.

In operation, as in FIG. 1, the electronic components 14 generate heat through normal operation. The heat from the electronic components 14 is transferred to the nonconductive liquid 16. The liquid 16 absorbs the heat and eventually the liquid 16 vaporizes (not shown). The vaporized liquid rises to an upper portion 40' of the container 12 and makes contact with the heat exchanger 34. The fluid (not shown) from the fluid system in the heat exchanger 34 absorbs the heat from the vaporized liquid, condensing the vapor back into the liquid form, which returns to the remainder of the liquid 16 in the bottom portion of the container 12, where the cycle begins again. The vapor that forms beneath the hood 20 forms bubbles (not shown). The bubbles carry a portion of entrained liquid (not shown) with them into respective first ends 24 and 30 of the tubes 22 and 24. The bubbles and the entrained liquid exit the tubes 22 and 28 at their respective second ends 26 and 32. The bubbles and entrained liquid exit the second end 32 of the second tube 28 below the liquid level 42, where the vapor bubbles rise towards the heat exchanger 34 and the entrained liquid remains with the remainder of the nonconductive liquid 16. The bubbles and entrained liquid exit the second end 26 of the first tube 22 above the liquid level 42, where the vapor bubbles rise towards the heat exchanger 34. The vapor bubbles and the entrained liquid are moving at a velocity that allows the entrained liquid to travel above the second end 26 of the first tube 22. At least a portion 46 of the entrained liquid, when exiting the second end 26 of the first tube 22 acts similar to a fountain and returns to the liquid level 42 by gravity, impinging onto the exposed portion 44 of the electronics 14 while simultaneously cooling the electronics 14.

Similarly, if the container 12 is oriented such that another portion 48 of the electronics 14 is exposed to vapor only (not shown), the second end 32 of the second tube 28 would be above the liquid line 42, and at least a portion (not shown) of the entrained liquid, when exiting the second end 32 of the second tube 28 acts similar to a fountain (not shown) and returns to the liquid level 42 by gravity, impinging onto the portion 48 of the electronics 14 while simultaneously cooling the electronics 14.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An apparatus for cooling electronic components disposed in a sealed container partially filled with a nonconductive liquid, the components being immersed in the liquid when the container is in a predetermined orientation relative to the ground, comprising:
    a hood disposed in a container adjacent electronic components immersed in a nonconductive liquid partially filling the container to a liquid level; and
    at least one cooling tube having one end connected to said hood and an opposite end disposed adjacent a portion of the electronic components whereby during operation the electronic components transfer heat to the liquid, causing a first portion of the liquid below said hood to vaporize forming bubbles, the bubbles traveling through said at least one tube and carrying an entrained second portion of the liquid to said opposite end, and when the container is oriented to expose the portion of the electronic components above the liquid level, the bubbles and the entrained liquid exit said opposite end of said at least one tube onto the exposed portion of the electronic components to cool the exposed portion of the electronic components.

2. The apparatus according to claim 1 including at least another cooling tube having one end connected to said hood and an opposite end disposed adjacent another portion of the electronic components.

3. The apparatus according to claim 1 wherein said hood has a downwardly curved shape.

4. A phase change cooling system for cooling automotive electronic components, comprising:

a sealed container;

a nonconductive liquid partially filling said container, the electronic components disposed therein, the components being immersed in the liquid when said container is in a predetermined orientation relative to the ground, a hood disposed in the container adjacent the electronic components immersed in a nonconductive liquid partially filling the container to a liquid level; and at least one cooling tube having one end connected to said hood and an opposite end disposed adjacent a portion of the electronic components whereby during operation the electronic components transfer heat to the liquid, causing a first portion of the liquid below said hood to vaporize forming bubbles, the bubbles travelling through said at least one tube and carrying an entrained second portion of the liquid to said opposite end, and when the container is oriented to expose the portion of the electronic components above the liquid level, the bubbles and the entrained liquid exit said opposite end of said at least one tube onto the exposed portion of the electronic components to cool the exposed portion of the electronic components.

5. The system according to claim 4 including at least another cooling tube having one end connected to said hood and an opposite end disposed adjacent another portion of the electronic components.

6. The system according to claim 4 wherein said hood has a downwardly curved shape.

7. A phase change cooling system for cooling an automotive electronic system, comprising:

a sealed container;

a plurality of electronic components, said components being a part of the electronic system and disposed in said container;

a plurality of high heat generating electronics, said high heat generating electronics being a part of the electronic system and disposed in said container;

a nonconductive liquid partially filling said container to a liquid level, said components and said high heat generating electronics being immersed in said liquid when said container is in a predetermined orientation relative to the ground, a hood disposed in said container adjacent said high heat generating electronics immersed in said nonconductive liquid below said liquid level; and at least one cooling tube having one end connected to said hood and an opposite end disposed adjacent a portion of said electronic components whereby during operation said electronic components and said high heat generating electronics transfer heat to said liquid, causing a first portion of said liquid below said hood to vaporize forming bubbles, the bubbles traveling through said at least one tube and carrying an entrained second portion of the liquid to said opposite end, and when the container is oriented to expose the portion of said electronic components above said liquid level, the bubbles and said entrained liquid exit said opposite end of said at least one tube onto said exposed portion of said electronic components to cool said exposed portion of said electronic components.

8. The system according to claim 7 including at least another cooling tube having one end connected to said hood and an opposite end disposed adjacent another portion of the electronic components.

9. The system according to claim 7 wherein said hood has a downwardly curved shape.

* * * * *